United States Patent [19]

Funaba

[11] Patent Number: 5,271,602
[45] Date of Patent: Dec. 21, 1993

[54] VACUUM GATE VALVE

[75] Inventor: Kazutoshi Funaba, Hiroshima, Japan

[73] Assignee: The Japan Steel Works Ltd., Tokyo, Japan

[21] Appl. No.: 841,817

[22] Filed: Feb. 26, 1992

[51] Int. Cl.$^5$ .............................................. F16K 3/18
[52] U.S. Cl. ........................... 251/335.3; 251/326; 251/328
[58] Field of Search ............... 251/335.3, 326, 335.1, 251/328, 329, 333

[56] References Cited

U.S. PATENT DOCUMENTS

| | | | |
|---|---|---|---|
| 2,856,151 | 10/1958 | Peters | 251/335.3 X |
| 3,179,372 | 4/1965 | Vaudreuil | 251/328 |
| 3,413,990 | 12/1968 | Gachot | 137/15 |
| 4,483,514 | 11/1984 | Kennedy | 251/327 |
| 4,531,539 | 7/1985 | Jandrasi et al. | 137/375 |
| 4,694,634 | 9/1987 | Anderson | 53/88 |
| 4,809,950 | 3/1989 | Geiser | 251/326 X |
| 4,921,213 | 5/1990 | Geiser | 251/326 X |
| 5,058,861 | 10/1991 | Baumann | 251/335.3 |

FOREIGN PATENT DOCUMENTS

| | | |
|---|---|---|
| 1223212 | 8/1966 | Fed. Rep. of Germany . |
| 1208769 | 2/1960 | France . |
| 1603656 | 6/1971 | France . |
| 63-312574 | 12/1988 | Japan . |
| 1-218628 | 8/1989 | Japan . |
| 1-261573 | 10/1989 | Japan . |

Primary Examiner—Martin P. Schwadron
Assistant Examiner—Kevin L. Lee
Attorney, Agent, or Firm—Sughrue, Mion, Zinn, Macpeak & Seas

[57] ABSTRACT

A vacuum gate valve device having a vacuum path includes: a valve casing; a valve body provided in the valve casing, the valve body being allowed to reciprocate between two positions to close and open the vacuum path; a bonnet flange for closing the casing; driving member provided on the bonnet flange for reciprocably driving the valve body, the driving member having a stem shaft which is loosely inserted into a through hole of the bonnet flange and is coupled with the valve body; and a member for isolating a sliding portion of the stem shaft from the vacuum path.

13 Claims, 4 Drawing Sheets

VACUUM GATE VALVE

BACKGROUND OF THE INVENTION

This invention relates to a vacuum gate valve which is employed as a sluice valve for a vacuum container in a semiconductor manufacturing device or the like, and more particularly to a seal structure thereof and to a guide mechanism for a stem shaft in the vacuum gate valve.

In a conventional vacuum gate valve of this type, in order to open and close its valve plate or to push the valve plate against the valve seat, a stem shaft coupled through a bellows to the valve plate is operated manually or with drive means such as a compressed air cylinder.

FIG. 7 is a sectional view showing the structure of an example of a conventional vacuum gate valve. In FIG. 7, reference numeral 1 designates a valve casing; 2, a valve plate which is reciprocated between two positions to open and close a vacuum path formed in the valve casing; 3, a stem shaft coupled to the valve plate 2; 9, a bonnet flange closing the valve casing 1; 70, a bushing fitted in a through hole formed in the bonnet flange 9 so as to slidably guide the stem shaft 3; 4, a bellows coupled between the bonnet flange 9 and a receiver on the stem shaft 3; and 10, an actuator for reciprocating the stem shaft 3.

In the above-described conventional vacuum gate valve, the stem shaft 3 and the bushing 70 are slidably engaged with each other in vacuum, and therefore they may, for instance, gall each other, thus making it impossible to open and close the valve. In addition, those components produce dust while wearing, which contaminates the pure vacuum atmosphere. Hence, the conventional vacuum gate valve cannot be employed for a semiconductor manufacturing device or the like.

In an another example of a conventional gate valve of this type, as disclosed by Japanese Patent Application (OPI) No. 312574/1988 (the term "OPI" as used herein means an "unexamined published application"), the valve plate is depressed with means such as a cam. Conventional gate valves having a mechanical structure can be disadvantageous in that components therein form abrasion dust when slid relative to one another.

In order to eliminate the above-described difficulty, Japanese Patent Application (OPI) No. 261573/1989 has disclosed a sluice valve in which a bellows is used to supply compressed air into a formed space to attain the sealing effect. This conventional device is still disadvantageous in that it is rather troublesome to switch the introduced air pressure in correspondence to the valve opening and closing operations, and if the bellows is broken, the compressed air flows into the vacuum container.

In order to solve the above-described problems, Japanese Patent Application (OPI) No. 218628/1989 has disclosed a sealing structure with a sealing surface and a closing member. However, this conventional device also involves problems. In particular, in the case when chambers on both sides of the closing member differ in pressure from each other, a great force acts on the closing member in the direction of axis of the opening, so that the piston rod may be bent, or the closing member may be shifted slightly in the axial direction, thus damaging the sealing member.

SUMMARY OF THE INVENTION

According to the first aspect of the invention, the above-described problems have been solved by the provision of a vacuum gate valve in which, in a valve casing, a valve plate is provided which is allowed to reciprocate between two positions to close and open a vacuum path formed therein, a stem shaft connected to the valve plate is loosely inserted into a through hole formed in a bonnet flange closing the valve casing, one end of a stretchable bellows, into which the stem shaft is loosely inserted, is secured to the bonnet flange, while the other end of the bellows is secured to a bellows movable flange coupled to the stem shaft, and the bellows movable flange is connected to direct acting guide bearings which are slidably guided by direct acting guide shafts provided outside the bellows.

As the stem shaft is moved outwardly or inwardly, the bellows, both ends of which are connected to the bonnet flange and the bellow movable flange coupled to the stem shaft, is contracted or stretched with the movement of the stem shaft. Therefore, the stem shaft, the bellows movable flange coupled to the stem shaft, and the direct acting guide bearing connected to the bellows movable flange are slidably while being guided by the direct acting guide shafts, so that the valve plate smoothly performs a valve closing operation or a valve opening operation.

In the vacuum gate valve of the invention, a slide guide mechanism, made up of the direct acting guide bearings and the direct acting guide shafts, is provided outside the bellows, outside the vacuum atmosphere. Hence, the vacuum gate valve of the invention is free from the difficulties accompanying the conventional vacuum gate valve that the stem shaft and the bushing gall each other, thus making it impossible to open and close the valve, and produce dust while wearing, which contaminates the pure vacuum atmosphere.

According to the second aspect of the invention, the above-described problems have been solved by the provision of a vacuum valve gate in which, a seal seat surface, which is substantially oval, is formed on a valve seat, the seal seat surface is made up of a first seal surface which is conical, and which forms an angle $\alpha$ with a plane B including an opening axis A—A and is tapered inwardly, second seal surfaces extended from the two arcuate portions R of the first seal surface, forming an angle $\beta$ with the plane B, and a third seal surface through which the seal surfaces are connected to each other, the valve seat has an opening extended along the opening axis A—A, which is surrounded by the first through third seal surfaces, a seal material is formed on a valve body which is engaged with the seal seat surface to open and close the opening, the seal material being made up of first through third seal material parts which are integral with one another and are brought into close contact with the first through third seal surfaces, respectively, and the valve body is allowed to move in an axial direction perpendicular to the plane B.

The vacuum gate valve is constructed as described above. Hence, when it is required to close the valve, the valve body with seal material is moved so that the first through third seal material parts of the seal material are brought into closed contact with the first through third seal surfaces. As a result, the first seal material part is compressed by the taper effect due to the angle $\alpha$ of the first seal surface, similarly the second seal material parts are compressed by the taper effect due to the angle $\beta$ of the second seal surfaces, and the third seal material part is compressed being pushed against the third seal surface by the valve body; that is, the opening is sealingly closed. When, on the other hand, it is required to open the valve, the valve body is moved in the opposite direction, to open the opening.

DETAILED DESCRIPTION OF THE PREFERRED EMBODIMENTS

One embodiment of this invention will be described with reference to the accompanying drawings.

Figure 1:
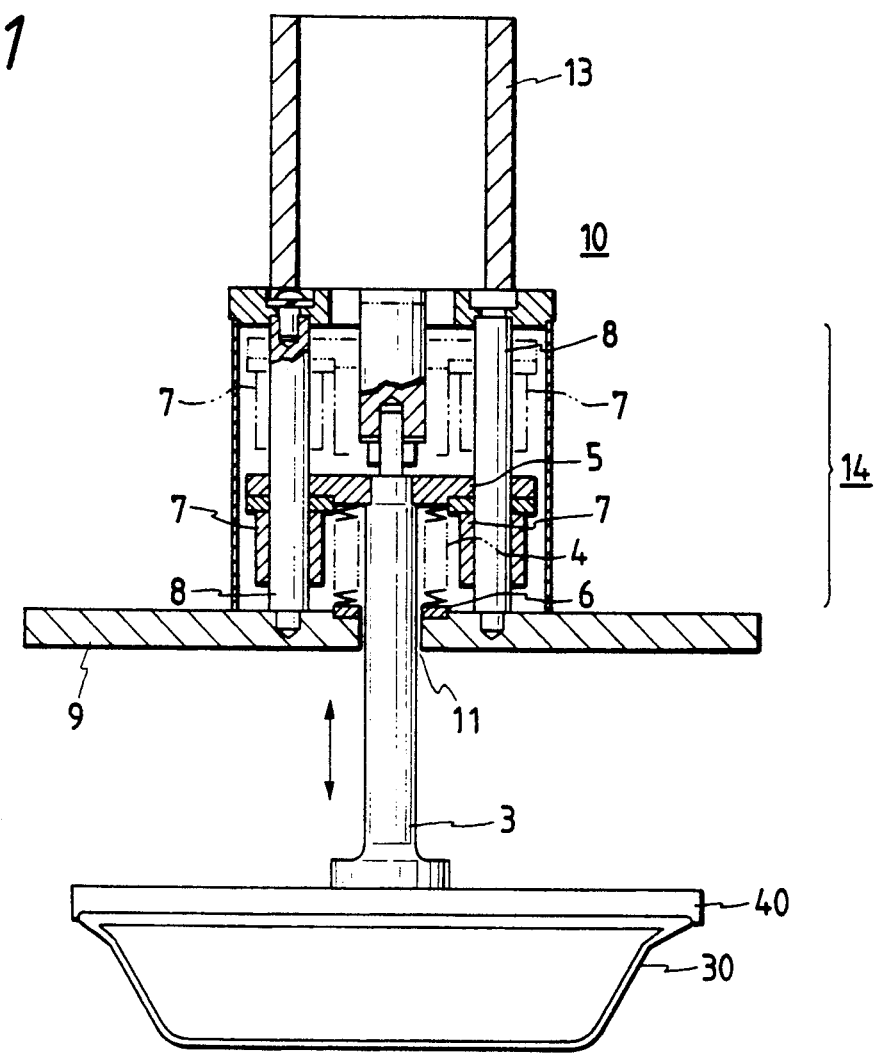
FIG. 1 is a sectional view showing the structure of an example of a vacuum gate valve according to the present invention.

FIG. 1 is a sectional view showing the structure of an example of a vacuum gate valve according to the invention. In FIG. 1, reference numeral 40 designates a valve plate which is reciprocated between two positions to open and close a vacuum path formed in a valve casing 60; 3, a stem shaft coupled to the valve plate 40; and 9, a bonnet flange closing the valve casing 60.

A stem shaft 3 coupled to the valve plate 40 is loosely inserted into a through hole 11 formed in the bonnet flange 9. The stem shaft 3 is further loosely inserted into a stretchable bellows 4, one end of which is connected to a bellow stationary flange 6 secured to the bonnet flange 9. The other end of the bellows 4 is secured to a bellows movable flange 5, which is coupled to the stem shaft 3 and to direct acting guide bearings 7.

The direct acting guide bearings 7 are slidably guided by direct acting guide shafts 8 provided outside the bellows 4. Reciprocating means such as an actuator 13 is coupled to the end of the stem shaft 3 on the side of the bellows movable flange 5. The reciprocating means 13 may be manually operated.

Driving means 10 includes the reciprocating means 13 and the guide means 14. The guide means 14 includes the direct acting guide shafts 8 which are perpendicularly positional with respect to the bonnet flange 9, the bellows movable flange 5 provided through the direct acting guide bearings 7 which is slidably held by the direct acting guide shafts 8, and the stem shaft 3 which is coupled to the central portion of the bellows movable flange 5.

The inside diameters of the bellows 4 and the bellows stationary flange 6, and the diameter of the through hole 11 formed in the bonnet flange 9 are larger than the outside diameter of the stem shaft 3. Therefore, the stem shaft 3 is not in contact with the bellows 4, the bellows stationary flange 6 and the bonnet flange 9; that is, the stem shaft is loosely inserted into these components.

In the vacuum gate valve of the invention thus constructed, the valve plate 40 is closed or opened as follows. The actuator 13 is operated to move the stem shaft 3 outwardly or inwardly, so that the bellows 4, ends of which are respectively connected to the bellow stationary flange 6 secured to the bonnet flange 9 and the bellow movable flange 5 coupled to the stem shaft 3, is contracted or stretched as the stem shaft 3 moves. Therefore, the stem shaft 3, the bellows movable flange 5 coupled to the stem shaft, and the direct acting guide bearing 7 connected to the bellows movable flange are slidably moved while being guided by the direct acting guide shafts 8, so that the valve plate 40 smoothly performs a valve closing operation or a valve opening operation (the valve plate 40 is moved downwardly or upwardly as indicated by the arrow in FIG. 1).

In the above-described embodiment, a slide guide mechanism, made up of the direct acting guide bearings 7 and the direct acting guide shafts 8, is provided outside the bellows 4; i.e., outside the vacuum atmosphere. Hence, the vacuum gate valve of the invention is free from the difficulties accompanying the conventional vacuum gate valve that the stem shaft 3 and the bushing 30 gall each other, thus making it impossible to open and close the valve, and produce dust while wearing, which contaminates the pure vacuum atmosphere.

Figure 2:
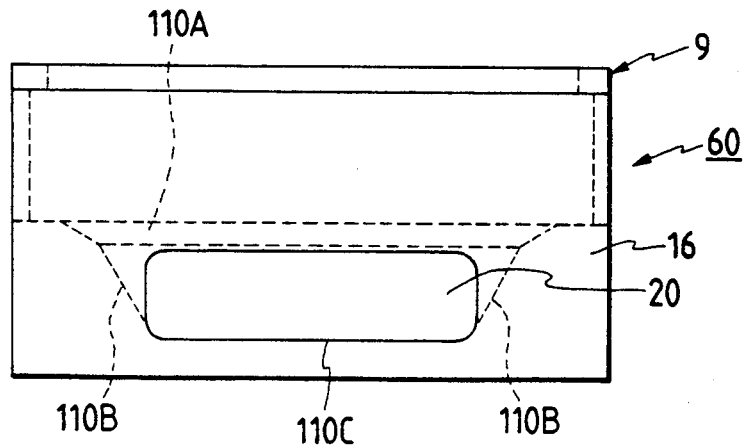
FIG. 2 is a sectional view showing the structure of a valve casing in an example of a gate valve according to the present invention.
Figure 3:
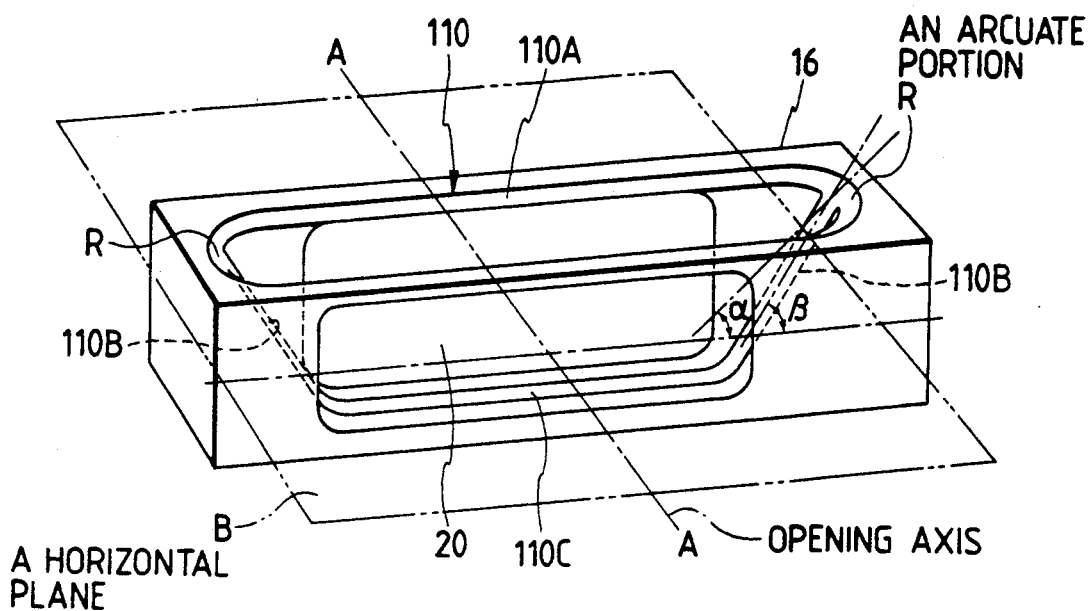
FIG. 3 is a perspective view for a description of a valve seat of the gate valve according to the present invention.
Figure 4:
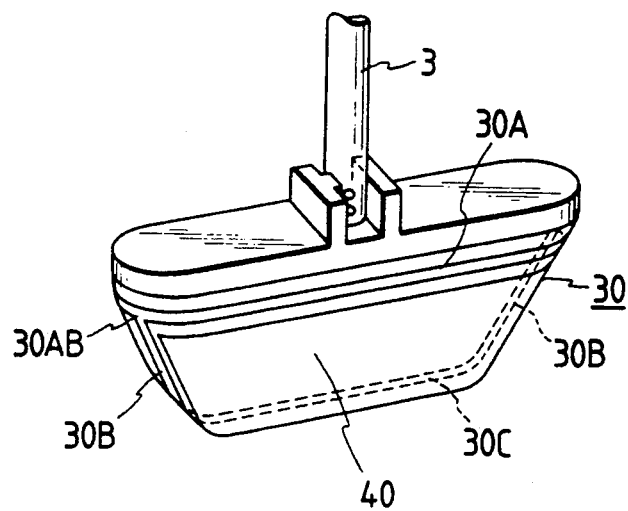
FIG. 4 is a perspective view for a description of a valve body in the gate valve of the invention.
Figure 5:
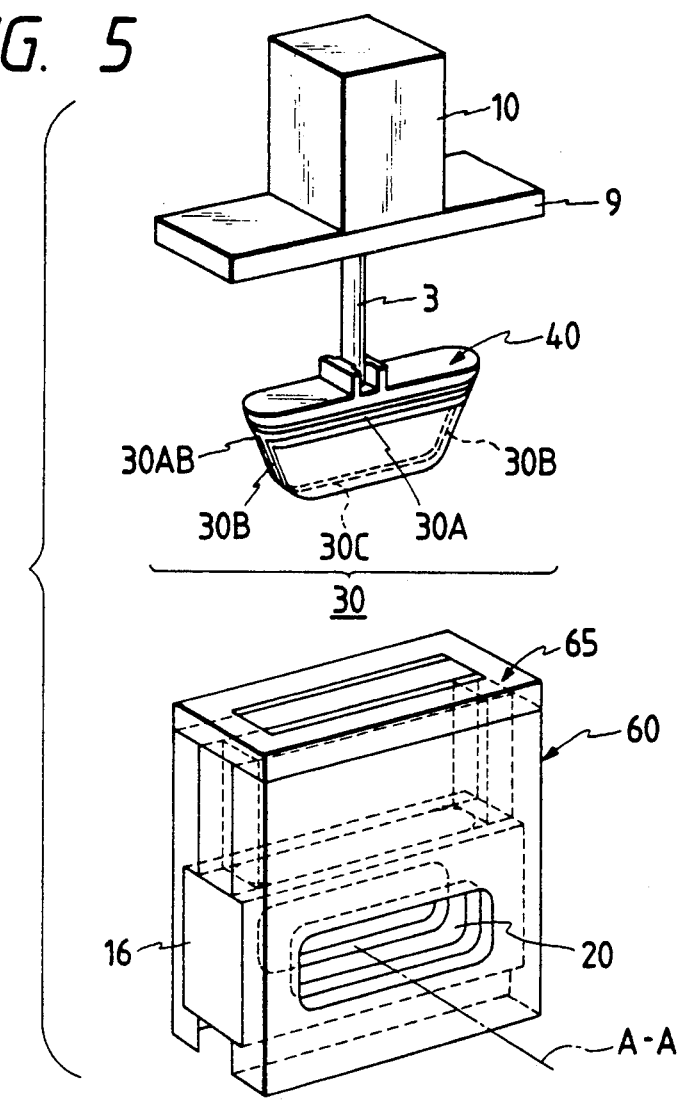
FIG. 5 is an exploded perspective view showing the whole arrangement of the gate valve of the invention, with the valve body and the valve seat separated from each other.

FIG. 2 is a sectional view showing the structure of a valve case in one example of a gate valve according to the present invention, FIG. 3 is a perspective view for a description of a valve seat of the gate valve according to the invention, FIG. 4 is a perspective view of a valve body in the gate valve, and FIG. 5 is an exploded perspective showing the whole arrangement of the gate valve, with the valve body and the valve seat separated from each other.

In the gate valve, as shown in FIG. 3, its valve seat 16 has a seal seat surface 110 which is substantially oval. The seal seat surface 110 is made up of a first seal surface 110A, two second seal surfaces 110B and 110B, and a third seal surface 110C. The first seal surface 110A is substantially conical, and forms an angle $\alpha$ with a horizontal plane B including an opening axis A—A and is tapered inwardly. The two second seal surfaces 110B and 110B are extended from the two arcuate portions R of the first seal surface 110A, forming an angle $\beta$ with the horizontal plane B. The two seal surfaces 110B and 110B are connected through the third seal surface 110C.

The valve seat 16 has an opening 20 extended in the direction of the opening axis A—A which is surrounded by those first through third seal surfaces 110A, 110B, 110B and 110C. As shown in FIG. 5, a closed-box-shaped valve casing 60 is formed with the valve seat 16 set in the lower portion. A valve plate 40 is accommodated in the upper portion of the valve casing 60. That is, the valve plate 40 is engaged with the seal seat surface 110 which is substantially in the form of a racing track, thus opening and closing the opening 20.

As shown in FIG. 4, a seal material 30 is formed on the valve plate 40. The seal material 30 is made up of first through third seal material parts 30A, 30B, 30B and 30C which are integral with one another and are brought into close contact with the first through third seal surfaces 110A, 110B, 110B and 110C, respectively. The valve plate 40 is movable in a direction perpendicular to the horizontal plane B. The seal material 30 is so designed in dimension that it is brought into close contact with the first through third seal surfaces 110A, 110B, 110B and 110C. In FIGS. 4 and 5, reference character 30AB designates T-shaped cross parts where the first seal material part 30A intersects with the second seal material parts 30B and 30B.

A stem shaft 3 is connected to the center of the upper surface of the valve plate 40. The stem shaft 3 thus connected is extended through a bonnet flange 9 provided on the side of the valve body, and connected to a drive means 10 such as an air cylinder mounted on the flange 9. At the connecting point, a sealing structure is provided which is of linear motion introduction type using a stretchable bellows (not shown in FIG. 5).

The bonnet flange 9 is sealingly connected through a sealing part such as an O-ring to a bonnet flange 65 of the valve casing 60. The drive means 10 is adapted to move the valve plate 40 through the stem shaft 3.

The gate valve of the invention is constructed as described above When it is required to close the gate valve, the valve plate 40 is moved in the direction of axis perpendicular to the horizontal plane B; i.e., downwardly in FIG. 4 so that the seal material 30 on the valve 40 is pushed against the seal surfaces 110A, 110B, 110B and 110C of the valve seat 16; that is, the opening 20 is sealingly closed with the valve seat. When, on the other hand, it is required to open the gate valve, the valve plate 40 is moved upwardly in FIG. 5 so that the opening 20 is opened.

It is not always necessary that the angle α of the first seal surface 110A with respect to the horizontal plane B is equal to the angle β of each of the second seal surfaces 110B and 110B with respect to the latter B. If those angles are not equal, the seal surface 110A merges with the seal surfaces 110B and 110B forming smooth curved lines therebetween. Therefore, in the case where the angles of the seal surfaces are equal, the valve seat can be machined with ease. In view of the degree of slide between the seal surfaces and the seal material, and the degree of compression of the seal material, the angles of the seal surfaces should be about 60°. However, it is obvious that the same sealing effect can be obtained with other angles.

Figure 6:
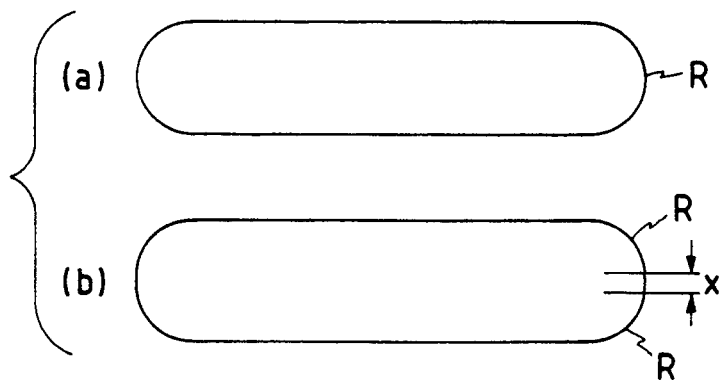
FIGS. 6(a) and 6(b) are explanatory diagrams showing two examples of a planar configuration of the valve seat taken in the plane including the opening axis.
Figure 7:
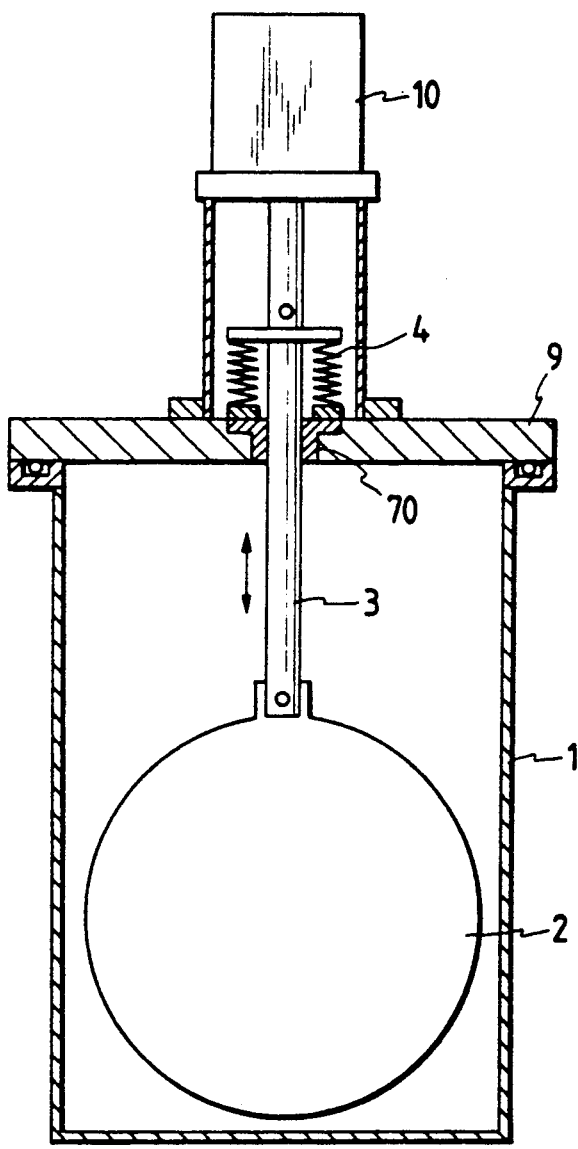
FIG. 7 is a sectional view showing the structure of an example of a conventional vacuum gate valve.

The arcuate portions R of the first seal surface 110A and the first seal material part 30A engaged with the latter may be semi-circular in section as shown in the part (a) of FIG. 6, or they may be partly linear as indicated at X in the part (b) of FIG. 6, or they may be of other configurations similar to those mentioned above.

It is not always necessary that the third seal surface 110C is linear; for instance, it may be part of an arcuate surface.

As was described above, in the vacuum gate valve of the invention, the valve plate 40 is provided in the valve casing 60 in such a manner that it is allowed to reciprocate between two positions to close and open a vacuum path formed therein, the stem shaft 3 connected to the valve plate 40 is loosely inserted into the through hole 11 formed in the bonnet flange 9 closing the valve casing 60, one end of the stretchable bellows 4, into which the stem shaft 3 is loosely inserted, is secured to the bonnet flange 9, while the other end of the bellows 4 is secured to the bellows movable flange 5 coupled to the stem shaft 3, and the bellows movable flange 5 is connected to the direct acting guide bearings 7 which are slidably guided by the direct acting guide shafts 8 provided outside the bellows 4. That is, the slide guide mechanism, made up of the direct acting guide bearings 7 and the direct acting guide shafts 8, is provided outside the bellows 4; i.e., outside the vacuum atmosphere. Hence, the vacuum gate valve of the invention is free from the difficulties accompanying the conventional vacuum gate valve that the stem shaft 3 and the bushing 30 gall each other, thus making it impossible to open and close the valve, and produce dust while wearing, which contaminates the pure vacuum atmosphere. Therefore, the vacuum gate valve of the invention is applicable to a semiconductor manufacturing device or the like which requires a pure vacuum atmosphere.

According to the second aspect of the invention, the seal seat surface which is substantially oval and is formed on the valve seat 16. The seal seat surface 110 is made up of: the first seal surface 110A which is conical, and forms the angle α with the plane B including the opening axis A—A and is tapered inwardly; the second seal surfaces 110B and 110B extended from the two arcuate portions R of the first seal surface 110A, forming the angle β with the plane B; and the third seal surface 110C through which the seal surfaces 110B and 110B are connected to each other. The valve seat 16 has the opening 20 extended along the opening axis A—A, which is surrounded by the first through third seal surfaces 110A, 110B, 110B and 110C. The seal material 30 is formed on the valve body 40 which is engaged with the seal seat surface 110 to open and close the opening 20. The seal material 30 is made up of the first through third seal material parts 30A, 30B, 30B and 30C which are integral with one another and are brought into close contact with the first through third seal surfaces 110A, 110B, 110B and 110C, respectively. The valve body 40 is allowed to move in an axial direction perpendicular to the plane B. Hence, merely by moving the valve body 40 into and out of engagement with the seal seat surface 110, the gate valve can be closed and opened, and the sealing and unsealing can be achieved. That is, the gate valve of the invention, unlike the conventional one, has no mechanical slide parts, and accordingly no abrasion powder is formed. When the valve is closed, in the first seal surface 110A, both sides (two opening ends) of the first seal material part 30A are supported by the valve seat 16 with the seal material 30 being held in close contact with the latter. Therefore, the gate valve of the invention is completely free from the difficulty that the valve body 40 is shifted by the difference in pressure between the chambers on both sides of the valve body. Thus, the opening can be positively sealingly closed.

What is claimed is:

1. A vacuum gate valve device having a vacuum path comprising:
   a valve casing;
   a valve body provided in said valve casing, said valve body being allowed to reciprocate between two positions to close and open the vacuum path;
   a bonnet flange for closing said casing, said bonnet flange having a through hole;
   driving means provided on said bonnet flange for reciprocally driving said valve body, said driving means having a stem shaft which is inserted into said through hole, in non-contacting relation thereto, and is coupled with said valve body;
   means for guiding said stem shaft between said two positions; and
   means for isolating said guide means from the vacuum path.

2. A vacuum gate valve device according to claim 1, wherein said driving means comprises:

reciprocating means for reciprocally operating said stem shaft, said guide means including,
a plurality of direct acting guide shafts which extend in a direction which is perpendicular to a surface of said bonnet flange,
a plurality of direct acting guide bearings each of which is slidably guided by said direct acting guide shaft, and
a bellows movable flange coupled to said stem shaft and slidably coupled to said direct acting guide shafts through said direct acting guide bearings.

3. A vacuum gate valve device according to claim 2, wherein said isolating means includes a stretchable bellows provided substantially coaxially with said stem shaft, one end of said bellows being secured to said bonnet flange and the other end of said bellows being secured to said bellows movable flange so as to surround said stem shaft.

4. A vacuum gate valve device according to claim 3, wherein said valve casing includes a valve seat, said valve seat having;
an upper surface;
a seal seat surface which is substantially oval, said seal seat surface containing
a first seal surface which forms a first predetermined angle with respect to said upper surface and is tapered inwardly,
a second seal surface continuously provided to said first seal surface, said second seal surface having a pair of side surfaces which form a second predetermined angle with respect to said upper surface, and
a third seal surface through which said pair of side surfaces are connected to each other; and
an opening passing through said valve seat.

5. A vacuum gate valve device according to claim 4, wherein said valve body is engaged with said seal seat surface to open and close said opening, said valve body includes:
a valve plate coupled to said stem shaft; and
a seal member provided on said valve plate, said seal member having a first seal part, a second seal part and a third seal part which are integral with one another and are brought into close contact with said first seal surface, said second seal surface and third seal surface, respectively when said valve is in a closed position.

6. A vacuum gate valve device comprising:
a valve seat having
an upper surface;
a seal seat surface which is substantially oval, said seal seat surface containing
a first seal surface which forms a first predetermined angle with respect to said upper surface and is tapered inwardly,
a second seal surface continuously provided to said first seal surface, said second seal surface having a pair of side surfaces which form a second predetermined angle with respect to said upper surface, and
a third seal surface through which said pair of side surfaces connected to each other;
an opening passing through said valve seat; and
a valve body engaged with said seal seat surface to open and close said opening, said valve body includes
a valve plate, and
a seal member provided on said valve plate, said seal member having a first seal part, a second seal part and a third seal part which are integral with one another and are brought into close contact with said first seal surface, said second seal surface and third seal surface, respectively.

7. A vacuum gate valve device according to claim 6, wherein said first predetermined angle is equal to said second predetermined angle.

8. A vacuum gate valve device according to claim 7, wherein said first and second predetermined angle are about sixty degrees.

9. A vacuum gate valve device according to claim 6, wherein said first predetermined angle is smaller than said second predetermined angle.

10. A vacuum gate valve device having a vacuum path, said valve device comprising:
a valve casing;
a valve body slidably mounted in said valve casing so as to be slidable between a first position, which corresponds to a closed state of said vacuum path, and a second position, which corresponds to an open state of said vacuum path;
a bonnet flange for closing said valve casing, said bonnet flange having a through hole formed therein;
means for driving said valve body between said first and second positions, said driving means having a stem shaft which extends through said through hole and is coupled to said valve body;
means for guiding said stem shaft, said guiding means comprising at least one guide shaft, which extends from said bonnet flange, a bearing slidingly engaged with each of said guide shafts, a movable flange fixed to said guide shaft and slidingly coupled to said guide shafts through said bearings.

11. A valve device as claimed in claim 10, further comprising:
a stretchable bellows provided substantially coaxial with said stem shaft, one end of said bellows being connected to said bonnet flange and the other end of said bellows being connected to said movable flange so as to isolate said guide means form said vacuum path.

12. A vacuum gate valve device according to claim 11, wherein said valve casing includes a valve seat, said valve seat having an upper surface and a seal seat surface, said seal seat surface comprising:
a first seal surface which is substantially oval and forms a first predetermined angle with respect to said upper surface and is tapered inwardly;
a second seal surface continuously provided to said first seal surface, said second seal surface having a pair of side surfaces which form a second predetermined angle with respect to said upper surface; and
a third seal surface through which said pair of side surfaces are connected to each other;
said valve seat having an opening passing there through.

13. A vacuum gate valve device according to claim 12, wherein said valve body is engaged with said seal seat surface to open and close said opening, said valve body includes;
a valve plate coupled to said stem shaft; and
a seal member provided on said valve plate, said seal member having a first seal part, a second seal part and a third seal part which are integral with one another and are brought into close contact with said first seal surface, said second seal surface and third seal surface, respectively when said valve is in a closed position.

* * * * *